United States Patent
Yang et al.

(10) Patent No.: US 6,353,405 B1
(45) Date of Patent: Mar. 5, 2002

(54) LOW DISTORTION VIDEO ANALOG-TO-DIGITAL CONVERTER

(75) Inventors: Ta-yung Yang, Taoyuan; Jenn-yu G. Lin, Taipei, both of (TW)

(73) Assignee: System General Corp., Milpitas, CA (US)

( * ) Notice: Subject to any disclaimer, the term of this patent is extended or adjusted under 35 U.S.C. 154(b) by 9 days.

(21) Appl. No.: 09/607,095

(22) Filed: Jun. 29, 2000

(51) Int. Cl.$^7$ ................................................. H03M 1/12
(52) U.S. Cl. ....................................... 341/155; 341/118
(58) Field of Search ................................ 341/144, 143, 341/118, 120

(56) References Cited

U.S. PATENT DOCUMENTS 5,812,077 A * 9/1998 Boie ........................... 341/155
5,874,909 A   2/1999 Soenen et al.
6,046,693 A * 4/2000 Wu ............................. 341/155

OTHER PUBLICATIONS

"A Low–noise Chopper–Stabilized Differential Switched–Capacitor Filtering Technique", IEEE J. of Solid–State Circuits, vol. SC–16, No. 6, Dec. 1981 p. 708–715.
"Noise in Buried Channel Charge–Coupled Devices", IEEE J. of Solid–State Circuits, vol. SC–11, No. 1, Feb. 1976 pp. 147–155.
"Characterization of Surface Channel CCD Image Arrays at Low Light Levels", IEEE J. of Solid–State Circuits, vol. SC–9, No. 1, Feb. 1974, pp. 1–13.
"LCCMOS 4–Channel, 12–Bit Simultaneous Sampling Data Acquistion System", Date Sheet of AD7874, Analog Devices Inc., Norwood, MA 02062, USA (No Date).
"Complete 12 Bit/10–Bit 6MSPS CCD/CIS Signal Processors", Date Sheet of AD9807/AD9805, Analog Devices Inc., Norwood, MA 02062, USA (No Date).
"LM9822 3 Channel 42–Bit Color Scanner Analog Front End", Data Sheet of LM9822, National Semiconductor Corp., Santa Clara. CA 95052. USA (No Date).

* cited by examiner

Primary Examiner—Brian Young
(74) Attorney, Agent, or Firm—J. C. Patents

(57) ABSTRACT

An analog to digital video converter is made of a differential correlated double sampling (DCDS) module, a DC bias circuit, an adjustment module and an analog-to-digital converter. The DCDS module samples a red, a green, and a blue analog signal respectively with a delay time, and then selects one of the sampled signals for outputting. The DC bias circuit is connected to the DCDS module for performing an analog addition to the output signal of the DCDS module. The adjustment module converts the digital adjustment data to an analog adjustable reference voltage. The analog-to-digital converter is connected to the output of the DC bias circuit and the adjustment module. By referring the adjustable reference voltage, the analog-to-digital converter converts the analog input signal to a digital output signal. Therefore, the analog input signal is equivalently adjusted by scaling the adjustable reference voltage.

6 Claims, 5 Drawing Sheets

LOW DISTORTION VIDEO ANALOG-TO-DIGITAL CONVERTER

BACKGROUND OF THE INVENTION

1. Field of Invention

The present invention relates to an analog-to-digital (A/D) converter for image sensors. More particularly, the present invention relates to a low distortion video A/D converter for image sensor interfaces.

2. Description of Related Art

For general imaging applications, such as scanners, images from charge couple device (CCD) have to be processed to compensate for non-uniform illumination of a subject. In order to obtain a correct two-dimensional picture from the CCD signal, several corrections or adjustments must be performed. For example, gain and offset corrections account for the difference in sensitivity between red, green and blue signals. A video A/D converter is used not only for converting the analog image signal to a digital signal, but also performing these corrections and adjustments.

FIG. 1 shows a conventional block diagram of a video A/D converter. The video A/D converter comprises a correlated double sampling (CDS) module, an A/D converter (ADC) 110, a DC restoring circuit 120, and a plurality of adjustment circuits 130, 140, 150 and a timing control circuit 160.

A typical CDS module 100 is illustrated in FIG. 2 for discussion of its operations. Referring to FIG. 2, the CDS module 100 comprises three CDS circuits and a 3-to-1 multiplexer 108. All of the three CDS circuits have the same structure. Taking the first CDS circuit for sampling the analog red signal $V_R$ as an example, the first CDS comprises a first sample/hold circuit 104a, a second sample/hold circuit 104b and a differential amplifier 106a. The first sample/hold circuit 104 a is driven by a control signal Vs and the second sample/hold 104b is driven by a control signal Rs. The analog red signal $V_R$ from a CCD is inputted to the first and the second sample/hold circuits 104a/104b through a capacitor $C_R$.

The conventional CDS module uses three CDS circuits to sample the red, green and blue signals $V_R$, $V_G$ and $V_B$ simultaneously. Accordingly, a signal Sc is simultaneously applied to the analog switches 102a, 102b and 102c to clamp simultaneously the capacitors $C_R$, $C_G$ and $C_B$ to a reset level (voltage $V_x$). The control signals Vs and Rs activate the sample/hold circuits 104a/104b for sampling the red signal $V_R$, the sample/hold circuits 104c/104d for sampling the green signal $V_G$, and the sample/hold circuits 104e/104f for sampling the blue signal $V_B$. The control signal Vs is applied to all of the first sample/hold circuits 104a/104c/104e, and the control signal Rs is applied to all of the second sample/hold circuits 104b/104d/104f.

After the analog switches 102a/102b/102c are disabled, the sample/hold circuits 104a/104b, 104c/104d, and 104e/104f begin to sample the red, green, and blue signal $V_R$, $V_G$, and $V_B$ respectively in response to the control signals Rs, Vs. As shown in FIG. 3, the sample/hold circuit 104b begins to sample the red signal $V_R$, obtaining a reset level voltage $V_1$, when the control signal Rs is transient to high, while the sample/hold circuit 104a begins to sample the red signal $V_R$, obtaining a video signal voltage $V_2$ when the control signal Vs is transient to high. Thereafter, the differential amplifier 106a receives the two input signals $V_1$ and $V_2$, and then outputs the result to the multiplexer 108. The operations for sampling the green and blue signals $V_G$ and $V_B$ are the same.

The multiplexer 108 then selects one of the outputs of the differential amplifier 106a, 106b and 106c and outputs an amplified signal $V_A$ to the ADC 110 at each clock period.

For the reasons discussed above, the conventional CDS module uses three CDS circuits for sampling the red, green and blue signals $V_R$, $V_G$ and $V_B$ simultaneously, and consequently the noise level is high and an electric magnetic interference (EMI) problem always occur.

In addition, a practical problem with the CDS circuit is that the output node of the differential amplifier slews back and forth between a video signal level and an initialized reset level at each clock period. This increases a settling time of the differential amplifier. Furthermore, this slew back and forth phenomenon also causes signal distortions.

Referring to FIG. 1 again, the outputted signal $V_A$ from the CDS module 100 is then received by the ADC 100 for converting the analog signal $V_A$ to a digital signal first according to a constant reference voltage $V_{REF}$. For example, when the ADC 110 outputs a digital red signal, the multiplexer 122 selects a DC bias from the red register 124a to the DC restoring circuit 120, the DC restoring circuit 120 then adds the DC bias to the digital red signal. Thereafter, the gain adjustment circuit 130 adjusts the gain of the digital red signal by multiplying a gain value selected by the multiplexer 132 from the red register 134a. The offset adjustment circuit 140 and shading adjustment circuit 150 then adjust the offset and shading of the digital red signal by multiplying an offset and a shading value respectively selected by the multiplexers 142, 152 from the red registers 144a, 154a.

Therefore, from the discussion above, the video signal is converted to digital in advance, and a number of adjustment operations, such as DC restoration, gain adjustment, offset adjustment and shading adjustment, are then performed in the digital domain. The majority of these adjustments are multiplication operations. However, due to the current technological limitations in speed and resolution, the data length (x-bit) of the digital output is limited to such as 12-bit, 14-bit or 16-bit, etc. Therefore, after each adjustment operation is performed, the generated data length is increased due to the multiplications, and must be truncated to meet data length requirement. The outputted signal is then distorted.

Accordingly, for the reasons discussed above, the conventional video A/D converter has several shortcomings. For example, a larger noise level and an EMI problem occur because all of the prime signals are sampled simultaneously. The slew back and forth phenomenon of the CDS circuit also causes signal distortions. In addition, all of the adjustment operations are performed by multiplication in digital domain, the outputted signal is then distorted because truncation of the data is necessary in view of the data length requirement.

SUMMARY OF THE INVENTION

The invention provides a video analog-to-digital converter, comprising a differential correlated double sampling (DCDS) module, a DC bias circuit, an adjustment module and an analog-to-digital (A/D) converter. The DCDS module is used for sampling a red, a green, and a blue analog signal respectively with a delay time, and then selecting one of the sampled red, green and blue analog signals for outputting. The DC bias circuit is connected to the DCDS module for performing an analog addition to the output signal of the DCDS module for the DC bias restoration. The adjustment module is used for converting a set of digital adjustment data to an analog adjustable reference voltage The A/D converter is connected to the output of the DC bias circuit and the output of the adjustment module. By referring the adjustable reference voltage, the A/D converter converts the analog input signal to a digital output signal.

The DCDS module further comprises three DCDS circuits for sampling the red, the green and the blue analog signals respectively, time delay circuits connected between the DCDS circuits, and a multiplexer is used for selecting one of the sampled red, green and blue analog signals as an output signal.

Advantageously, the DCDS circuit can overcome the slew back and forth phenomenon of the conventional CDS circuit. In addition, the restoration of the DC bias and all of the adjustments are performed in the analog domain to avoid the truncation that causes signal distortion. Furthermore, the time delay circuits are used in the DCDS module to avoid simultaneous sampling from the CCD sensor, thereby reducing the noise level and the EMI problem.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to overcome the shortcomings of the conventional video A/D converter, the present invention provides a differential correlated double sampling (DCDS) circuit to overcome the slew back and forth phenomenon of the CDS circuit. In addition, the restoration of the DC bias and all of the adjustments are performed in the analog domain to avoid the truncation that cause signal distortion. Furthermore, time delay circuits are used in the DCDS module to avoid simultaneous sampling from the CCD sensor, thereby reducing the noise level and the EMI problem.

Figure 1:
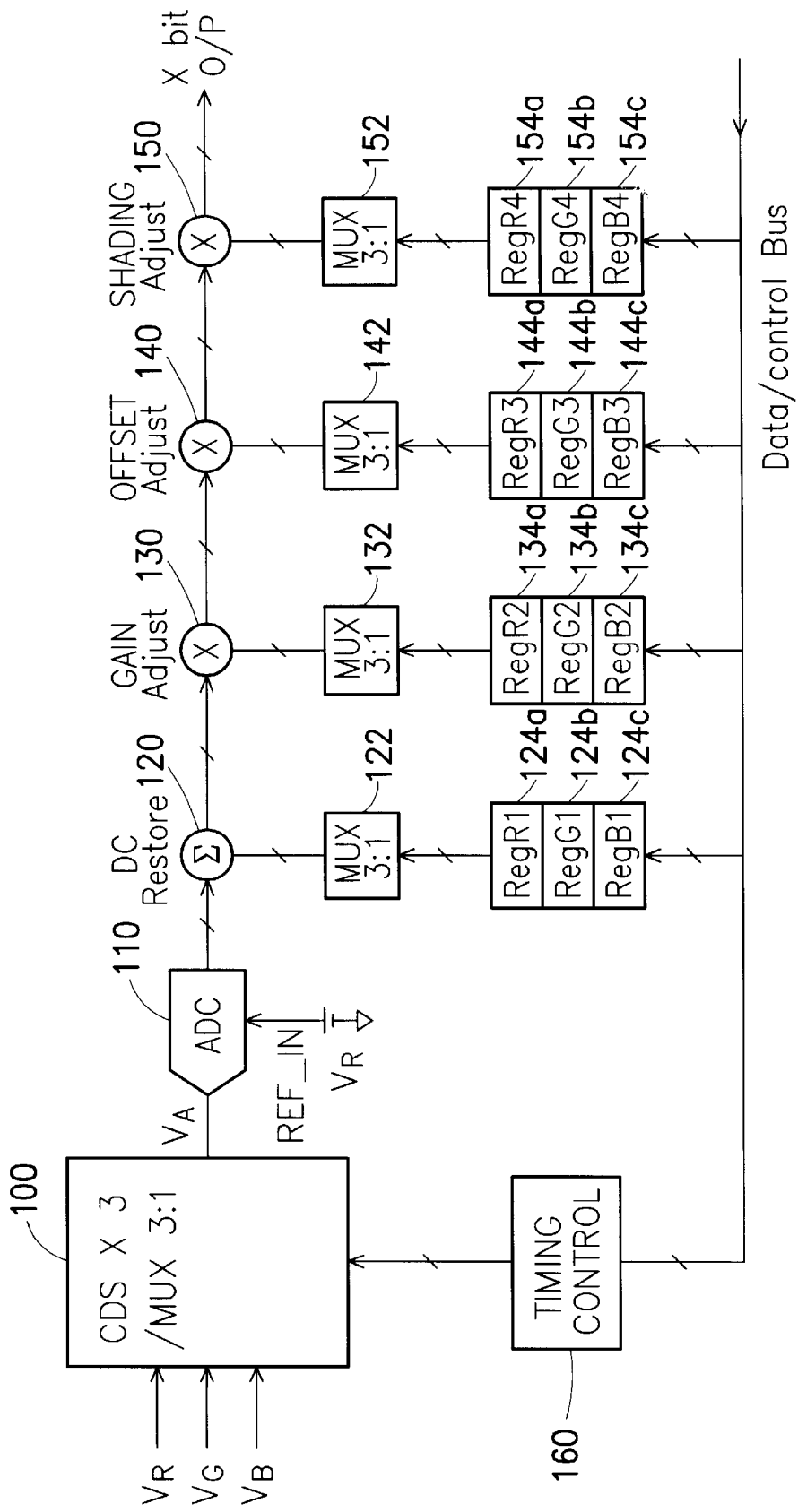
FIG. 1 shows a conventional block diagram of a video A/D converter.
Figure 2:
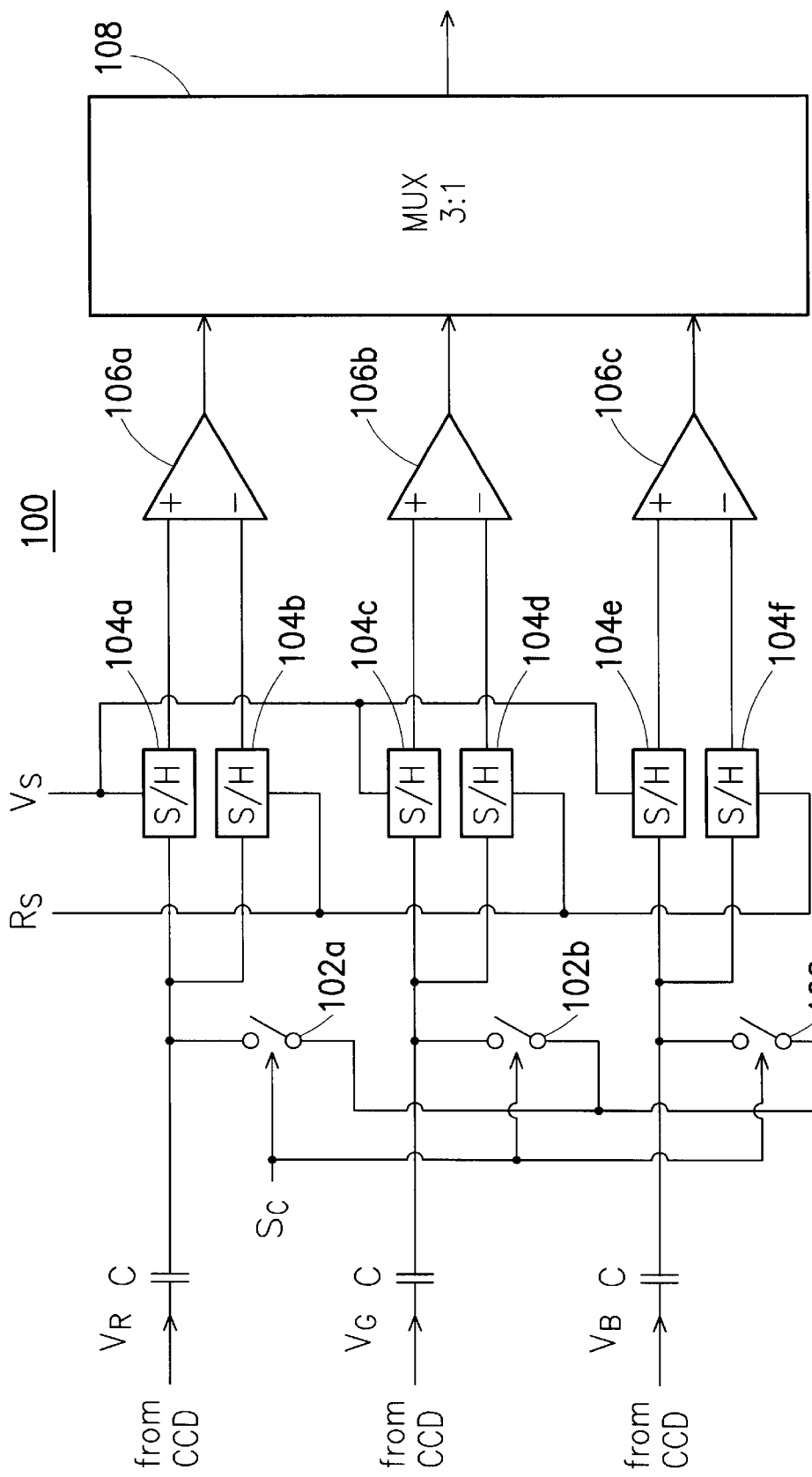
FIG. 2 illustrates a detailed circuit diagram of a correlated double sampling (CDS) circuit shown in FIG. 1.
Figure 3:
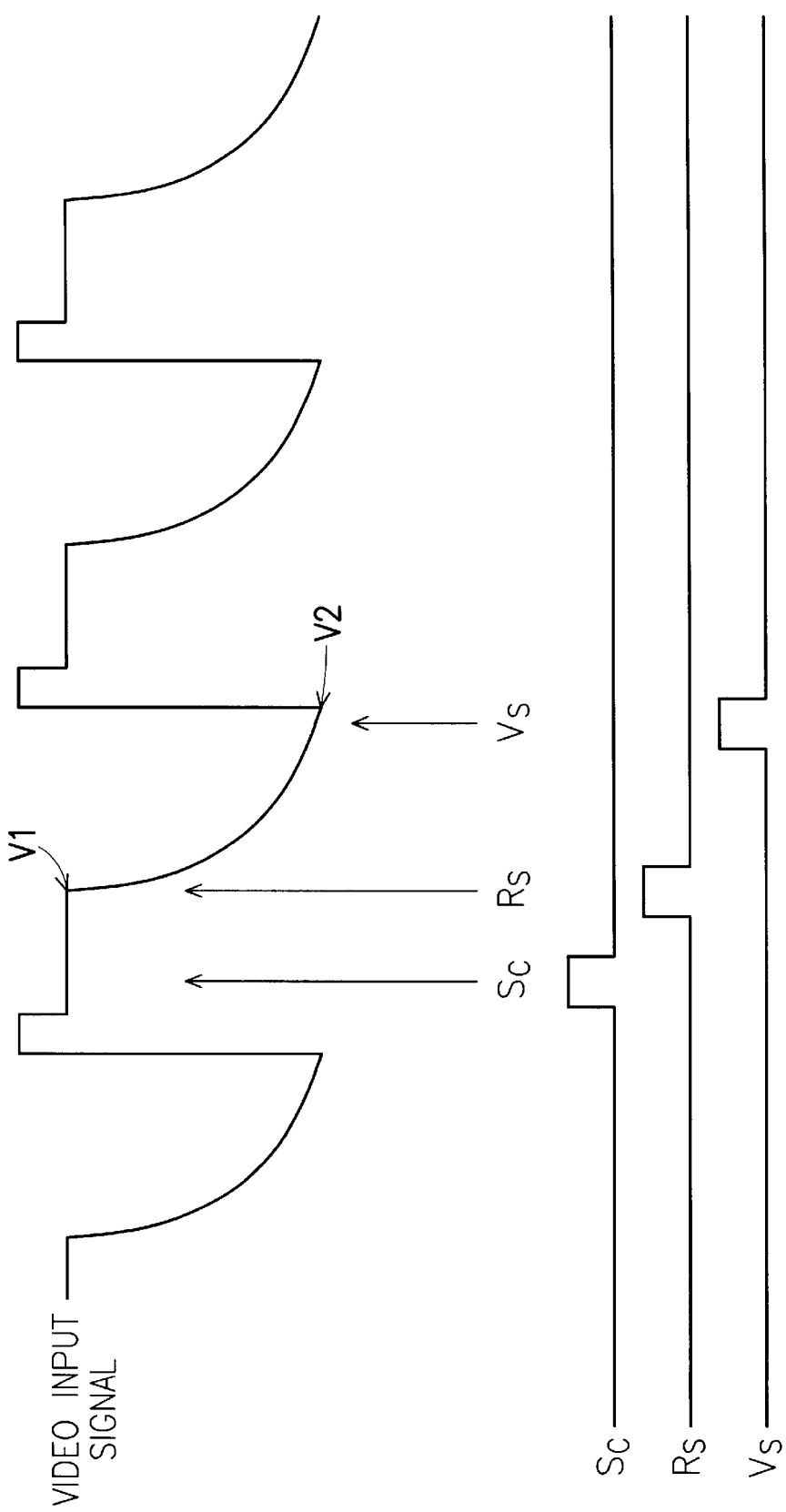
FIG. 3 shows a timing chart for illustrating that the inputted video signal is sampled.
Figure 4:
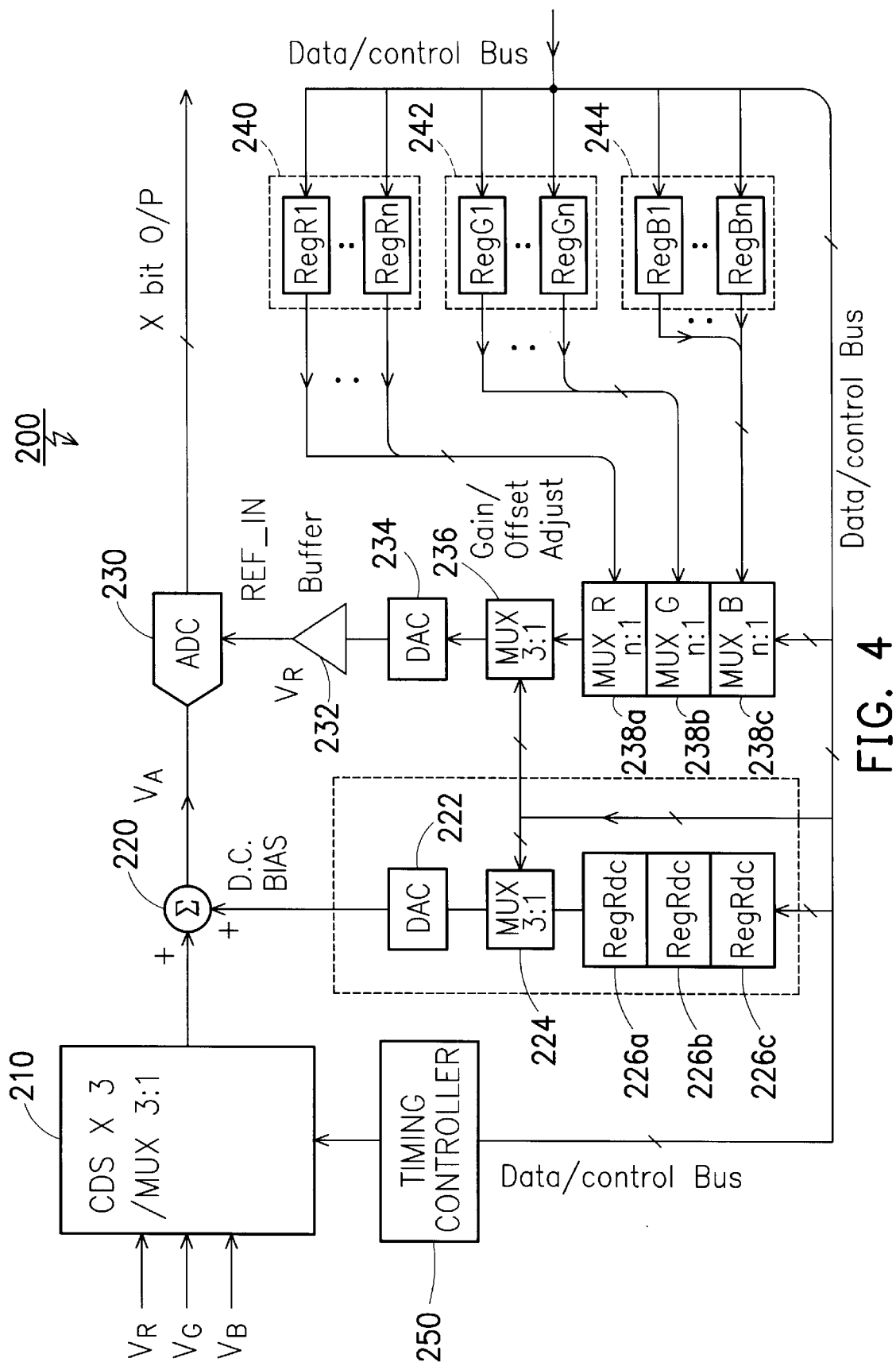
FIG. 4 schematically shows block diagram of a video A/D converter according to one preferred embodiment of the present invention.

FIG. 4 schematically shows block diagrams of a video A/D converter 200 according to one preferred embodiment of the present invention. The video A/D converter 200 comprises a DCDS module 210, a DC bias circuit 220, an ADC 230, a timing controller 250, a rail-to-rail buffer 232 and an adjustment module 240.

The DC bias circuit 220 comprises a summing circuit 221, a digital-to-analog converter (DAC) 222, a multiplexer 224, and a number of registers 226a–c.

The adjustment module 240 comprises a DAC 234, a number of multiplexers 236, 238a–c, and a number of registers 241/242/243.

The DCDS module 210 comprises three DCDS circuits and a multiplexer. The number of the DCDS circuits is determined by which primary color sequence is used. For example, if an R-G-B primary color sequence is used, three DCDS circuits are then used to sample analog color signals respectively. The CCD sensor generates three analog signals $V_R$, $V_G$ and $V_B$. The DCDS module 210 then receives the three analog signals $V_R$, $V_G$ and $V_B$ and samples the three analog signals $V_R$, $V_G$ and $V_B$ respectively by a delay time $\Delta T$. Namely, when the red signal $V_R$ is sampled, the green signal $V_G$ is then sampled after a delay time $\Delta T$; and when the green signal $V_G$ is sampled, the blue signal $V_B$ is then sampled after a delay time $\Delta T$.

Therefore, the present invention overcomes the larger noise level and the EMI problem that occurs in the conventional video A/D converter due to simultaneous sampling of all the prime signals. The detailed operation and circuit of the delay time are described together with the DCDS module as following.

The multiplexer of the DCDS module 210 then selects one of the three sampled analog signals at each one-clock period. For convenience, the sampled red signal is used for description; the green and blue ones are the same and are omitted to avoid redundancy.

The adjustment operations arc then performed on the selected Output signal of the DCDS module 210 in the analog domain during the conversion from analog to digital. For example if the DCDS module 210 outputs a red signal, a DC bias has to be restored to the red signal first. Accordingly, the multiplexer 224 selects a red DC bias $R_{dc}$ from the register 226a. The DAC 222 converts the red DC bias $R_{dc}$ from digital to analog. The summing circuit 221 sums the analog signal of the red DC bias $R_{dc}$ to the sampled red signal, and outputs signal $V_A$.

After the DC bias is restored, the adjustments are further performed for adjusting the gain, offset, or shading in the analog domain. According to the present invention an adjustable reference voltage $V_{AREF}$ is used to perform the adjustment operations. For example, if the inputted analog signal $V_A$ is 2 V, the adjustable reference voltage $V_{AREF}$ can be adjusted to 2V to obtain a full-scale output, or adjusted to 4V to obtain a half scale output.

The registers 241 consisting of resisters $R_1, \ldots, R_n$ are used to store the data for the adjustment. The registers 242 and 243 have the same function. The multiplexer 238a, such as an n-to-1 multiplexer, is used for selecting one of the registers $R_1, \ldots, R_n$. For example, the multiplexer 238a selects data from the register $R_1$ to perform the adjustment on the analog signal $V_A$. The multiplexer 236 then selects the output of the multiplexer 238a, and the DAC 234 converts the output of the multiplexer 236 to an analog value. By choosing an adjustable reference voltage $V_{AREF}$ to scale the input signal $V_A$, the ADC 230 then converts the input signal $V_A$ into a digital output. Similarly, all of the adjustment operations are performed in the same manner in the analog domain.

The adjustments are performed by scaling the input signal during the analog to digital conversion, rather than by multiplying values in digital domain. Contrary to the conventional video A/D converter, no extra bits occur and no truncation is needed. Accordingly, the original signals are not distorted.

Taking the output data length is 12-bit ($b_0, b_1, \ldots, b_{11}$) as an example, the analog signal $V_A$ and the digital output $b_0$, $b_1, \ldots, b_{11}$ are converted referring to the adjustable reference voltage $V_{AREF}$ by the following equation:

$$V_A = b_{11} \cdot \frac{2048}{4095} \cdot V_{AREF} + b_{10} \cdot \frac{1024}{4095} \cdot V_{AREF} + \ldots +$$
$$b_2 \cdot \frac{4}{4095} \cdot V_{AREF} + b_1 \cdot \frac{2}{4095} \cdot V_{AREF} + b_0 \cdot \frac{1}{4095} \cdot V_{AREF}$$

As the adjustable reference voltage $V_{AREF}$ decreases, a larger digital output is obtained, which means that the signal $V_A$ is equivalently amplified. And, as the adjustable reference voltage $V_{AREF}$ increases, a smaller digital output is obtained; i.e., the signal $V_A$ decays equivalently. Therefore, the analog signal $V_A$ is equivalently adjusted by scaling the adjustable reference voltage $V_{AREF}$.

According to the foregoing discussion, scaling the input signal during the analog to digital conversion performs all of the adjustments, and no truncation is necessary. Therefore, the outputted digital signals are not distorted.

Figure 5:
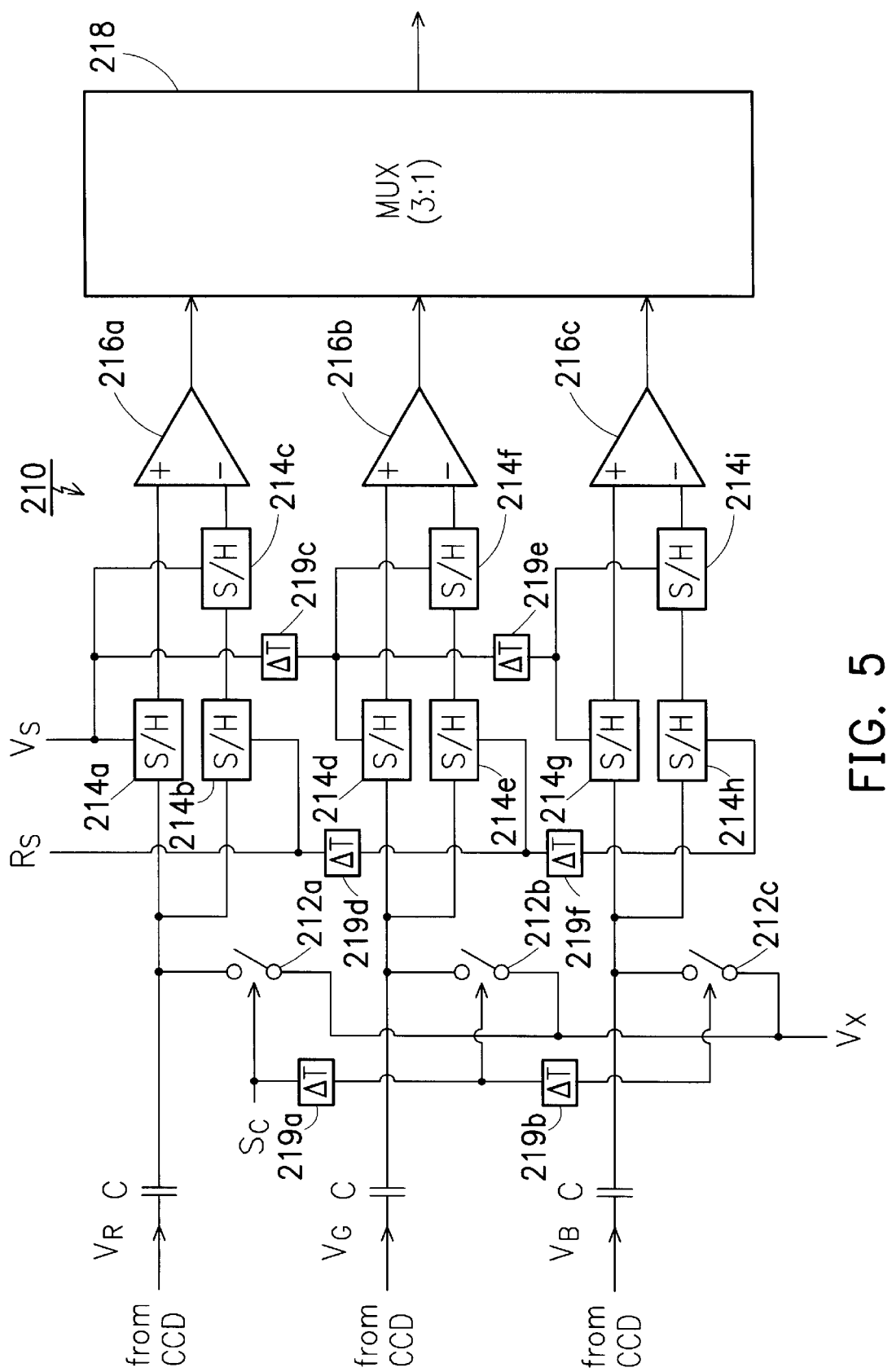
FIG. 5 schematically shows an exemplary circuit diagram of a differential correlated double sampling (DCDS) module shown in FIG. 4.

FIG. 5 schematically shows an exemplary circuit diagram of the differential correlated double sampling (DCDS) module 210 shown in FIG. 4. The DCDS module 210 comprises three DCDS circuits and a multiplexer 218. All of the three DCDS circuits have the same structure. The multiplexer 218 can select one of the output signals from the three DCDS circuits for outputting.

Taking the first DCDS circuit for sampling the red signal $V_R$ as an example, the first DCDS circuit comprises a first sample/hold circuit 214a, a second sample/hold circuit 214b, a third sample/hold circuit 214c and a differential amplifier 216a. The first sample/hold circuit 214a is driven by a control signal Vs and the second sample/hold circuit 214b is driven by a control signal Rs. The additional third sample/hold circuit 214c is used to enable the output of the second sample/hold circuit 214b to the differential amplifier 216a until the first sample/hold circuit 214a samples the red signal $V_R$.

Due to the third sample/hold circuit 214c, the sampled signal by the second sample/hold circuit 214b is synchronized with the control signal Vs. Then the inputs of the differential amplifier 216a can receive the sampled values by the first and second sample/hold circuit 214a/214b, thereby avoiding the slew back and forth phenomenon of the conventional CDS circuit.

Furthermore, time delay circuits are connected between the three DCDS circuits. For example, time delay circuit 219a, 219d and 219c are respectively connected between the analog switches 212a and 212b, between the sample/hold circuit 214b and 214e, and between the sample/hold circuit 214a and 214d. Due to the time delay circuits 219a–219f, the input red signal $V_R$, green signal $V_G$ and blue signal $V_B$ are not sampled simultaneously. Therefore, the noise level and the EMI problem are reduced.

For the reasons discussed above, the conventional CDS circuit uses three CDS circuits for sampling the red, green and blue signals, $V_R$, $V_G$ and $V_B$, simultaneously; consequently, a larger noise level and an electric magnetic interference (EMI) problem always occur.

Advantageously, the present invention provides the DCDS circuit to overcome the slew back and forth phenomenon of the conventional CDS circuit. In addition, the restoration of the DC bias and all of the adjustments are performed in the analog domain to avoid the truncation that causes signal distortion. Furthermore, time delay circuits are used in the DCDS module to avoid simultaneously sampling from the CCD sensors, thereby reducing the noise level and the EMI problem.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A video analog-to-digital converter, comprising:
   a differential correlated double sampling (DCDS) module for sampling a red, a green, and a blue analog signal respectively with a delay time, and selecting one of the sampled red, green and blue analog signals for outputting, wherein the DCDS module comprises three DCDS circuits for sampling the red, the green and the blue analog signals respectively, time delay circuits are connected between the three DCDS circuits, and a multiplexer selects one of the sampled red, green and blue analog signals as an output signal;
   a DC bias circuit connected to the output of the DCDS module for performing an analog addition to the output signal of the DCDS module and then outputting a biased-signal;
   an adjustment module for converting the digital adjustment data to an adjustable-reference-voltage;
   an analog-to-digital converter connected to the output of the DC bias circuit and the output of the adjustment module for converting the biased-signal to a digital-output by referring the adjustable-reference-voltage.

2. The video analog-to-digital converter of claim 1, further comprising a timing controller connected to the DCDS module, the DC bias circuit and the adjustment module.

3. The video analog-to-digital converter of claim 1, further comprising a buffer connected between the analog-to-digital converter and the adjustment circuit module.

4. The video analog to digital converter of claim 3, wherein the buffer is a rail-to-rail buffer.

5. A differential correlated double sampling (DCDS) module for an image sensor interface, comprising:
   three DCDS circuits for sampling a red, a green and a blue analog signal respectively, wherein each of the DCDS circuit further comprises:
   a first sample/hold circuit for sampling an input analog signal in response to a first control signal to generate a first sampled signal;
   a second sample/hold circuit for sampling the input analog signal in response to a second control signal to generate a second sampled signal;
   a third sample/hold circuit connected to the second sample/hold circuit for enabling the second sampled signal, whereby the second sampled signal is synchronized with the first control signal; and
   a differential amplifier connected to the first sample/hold circuit and the third sample/hold circuit, for receiving the first sampled signal and the second sampled signal and then outputting an amplified signal;
   time delay circuits connected between the DCDS circuits; and
   a multiplexer for selecting one of the amplified red, green and blue analog signals as an output signal.

6. A differential correlated double sampling circuit for sampling an input signal, comprising:

a first sample/hold circuit for sampling the input signal in response to a first control signal to generate a first sampled signal;

a second sample/hold circuit for sampling the input signal in response to a second control signal to generate a second sampled signal;

a third sample/hold circuit connected to the second sample/hold circuit for enabling the second sampled signal, whereby the second sampled signal is synchronized with the first control signal; and a differential amplifier connected to the first sample/hold circuit and the third sample/hold circuit, for receiving the first sampled signal and the second sampled signal and then outputting an amplified signal.

* * * * *